United States Patent [19]

Shimada et al.

[11] Patent Number: 5,490,095

[45] Date of Patent: Feb. 6, 1996

[54] METHOD OF EXTRACTING PARAMETERS FOR CIRCUIT SIMULATION

[75] Inventors: Shigeru Shimada, Hoya, Japan; Michael Saniei, Sunnyvale; Balaji Krishnamachary, Mountain View, both of Calif.

[73] Assignees: Hitachi, Ltd., Tokyo, Japan; VLSI Technology Incorporated, San Jose, Calif.

[21] Appl. No.: 5,821

[22] Filed: Jan. 19, 1993

[30] Foreign Application Priority Data

Jan. 22, 1992 [JP] Japan ................................. 4-031378

[51] Int. Cl.[6] .................................................. G06F 17/50
[52] U.S. Cl. ........................................... 364/578; 364/488
[58] Field of Search ..................................... 364/490, 489, 364/488, 578; 395/500

[56] References Cited

U.S. PATENT DOCUMENTS

| | | | |
|---|---|---|---|
| 5,210,699 | 5/1993 | Harrington | 364/488 |
| 5,247,456 | 9/1993 | Ohe et al. | 364/491 |
| 5,278,770 | 1/1994 | Gore et al. | 364/490 |

OTHER PUBLICATIONS

"Automated Extraction of SPICE Circuit Model from Symbolic Gate Matrix Layout with Printing" by Freeman et al., IEEE 23rd Design Automation Conf., 1986, pp. 418–424.

"Resistance Extraction in a Hierarchical IC Artwork Verification System" by Mori et al., IEEE 1985, pp. 196–198.

"LAS: Layout Pattern Analysis System with New Approach" by Okamura et al., IEEE 1982, pp. 308–311.

IEEE 1987 Custom Integrated Circuits Conference, pp. 133–136.

*Primary Examiner*—Vincent N. Trans
*Attorney, Agent, or Firm*—Fay, Sharpe, Beall, Fagan, Minnich & McKee

[57] ABSTRACT

In extracting parameters for use in circuit simulation of an IC device having a plurality of insulated gate field-effect transistors (IGFETs), layout data for patterns for the IC device are prepared. The patterns include gate patterns for the IGFETs, at least one of which is a bent gate pattern such that drain and source regions are defined on opposite sides of the bent gate pattern. An index symbol data is added to the layout data, which is for the bent gate pattern, to thereby form designed pattern data. For higher accuracy of the circuit simulation, the index symbol data in the designed pattern data is detected and used to produce parameters concerning the gate patterns for the IGFETs, thereby contributing to determination of a capability of controlling electric current in the IGFETs.

6 Claims, 4 Drawing Sheets

$N_f = N_r$ $N_f \neq N_r$

METHOD OF EXTRACTING PARAMETERS FOR CIRCUIT SIMULATION

BACKGROUND OF THE INVENTION

The present invention relates to parameter extraction for circuit simulation of a semiconductor integrated circuit device including, for example, a plurality of MOSFETs (metal oxide semiconductor field effect transistors). In the specification, "MOSFET" is a general term for insulated gate field-effect transistors.

There are large scale integrated circuit devices including MOSFETs such as microprocessors. As a system for extracting parameters to be used for circuit simulation of a large scale integrated circuit device, a HICE (Hierarchical Circuit Extraction) system is known.

The HICE system is described in Proc. IEEE CICC (Custom Integrated Circuits Conference), May 1987, pp. 133–136, for example.

A semiconductor integrated circuit device is typically developed in accordance with procedures shown in FIG. 1.

In logic design procedure 10, it is determined what gate functions should be possessed by function blocks to be used and how those function blocks should be arranged.

In circuit design procedure 20, the circuit configuration of each function block is determined.

In layout pattern design procedure 30, the layout of a plurality of patterns for implementing, on a semiconductor wafer, the circuit configuration determined in circuit design procedure 20 is determined.

In delay library preparation procedure 40, the parameters for circuit simulation are extracted to prepare netlist or circuit descriptions by using layout information designed in the layout pattern design procedure 30 (410). Then, circuit simulation is executed to derive circuit delay data (420), and the circuit delay data are entered in a delay library together with pattern data, the netlist and the others (430).

FIG. 2 is a top view showing a part of a layout pattern of a semiconductor integrated circuit device. Layout patterns of two MOSFETs Q1 and Q2 are shown in FIG. 2. With reference to FIG. 2, the MOSFET Q1 has a linear gate SG laid out rectilinearly (i.e., having a rectilinear gate pattern) on an effective area (an area in which active elements should be formed such as a doped area having impurities introduced therein, which is referred to herein as a diffusion layer), whereas the MOSFET Q2 has a bent gate BG so laid out to be bent (i.e., having a bent gate pattern) on a diffusion layer DB.

In a conventional parameter extraction system, parameter extraction for the bent gate BG of the MOSFET Q2 was conducted in the same way as the parameter extraction for the linear gate SG of the MOSFET Q1. That is to say, the effective channel width $W_{eff}$ was derived as the total length of the gate pattern measured along the center lines of the bent gate BG as shown in FIG. 2 and represented as the sum $W_a+W_b+W_c$ ($W_{eff}=W_a+W_b+W_c$). In this method, however, the width effectively functioning as a channel in bends A and B having low current control capability was derived in the same way as the channel width in the linear gate SG. Therefore, the current control capability of the MOSFET Q2 derived by using the above described circuit simulation using $W_{eff}$ often produced an error of, say, approximately 5% with respect to the current control capability of the MOSFET Q2 of a semiconductor integrated circuit device actually manufactured.

Herein, the "current control capability" of a MOSFET is a value proportional to the value of a drain current let flow when predetermined voltages are applied to the drain and gate of the MOSFET.

SUMMARY OF THE INVENTION

It is a primary object of the present invention to provide an improved technique for extracting parameters from a layout pattern designed in the pattern design for a semiconductor integrated circuit device, the parameter extracting technique being effective in enhancing the accuracy of the circuit simulation for the semiconductor integrated circuit device.

According to one aspect of the present invention, for extraction of parameters for use in circuit simulation of a semiconductor IC device having a plurality of insulated gate field-effect transistors (IGFETs), layout data for patterns for the IC device are prepared. These patterns include gate patterns for the IGFETs, at least one of which is a bent gate pattern such that drain and source regions are defined on opposite sides of the bent gate pattern. An index symbol data is added to the layout data for the bent gate pattern to thereby form designed pattern data. For higher accuracy of the circuit simulation, the index symbol data in the designed pattern data is detected and used to produce parameters concerning the gate patterns for the IGFETs contributing to determination of a capability of controlling electric current in the IGFETs.

DESCRIPTION OF THE PREFERRED EMBODIMENTS

Figure 3:
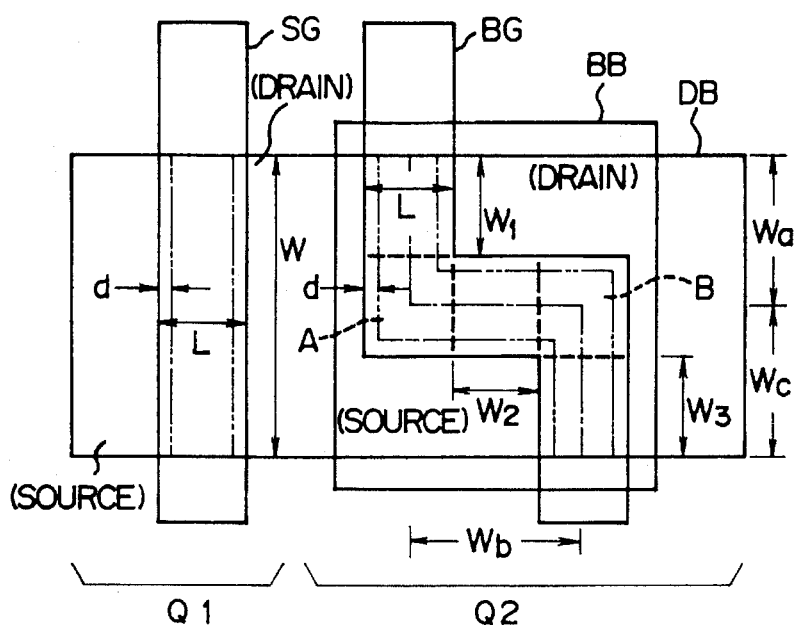
FIG. 3 is a top view showing the layout pattern of a part of an integrated circuit device and a virtual bend index layer to describe a parameter extraction method for circuit simulation according to an embodiment of the present invention.

FIG. 3 shows an example of a plane layout, which is a part of a large scale integrated circuit device, for explaining a parameter extraction method according to an embodiment of the present invention.

Figure 1:
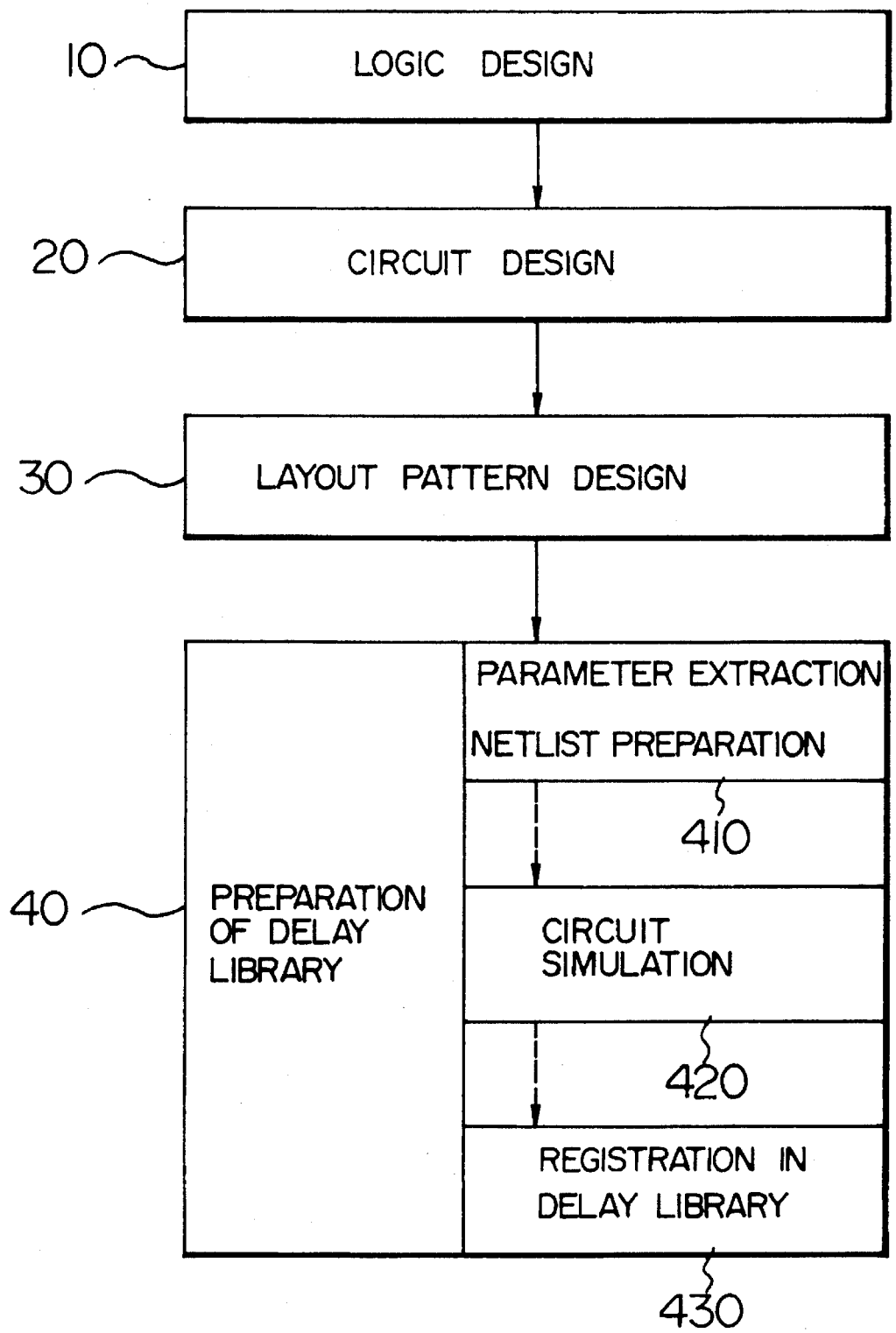
FIG. 1 is a flow diagram showing a procedure for developing semiconductor integrated circuit devices.
Figure 2:
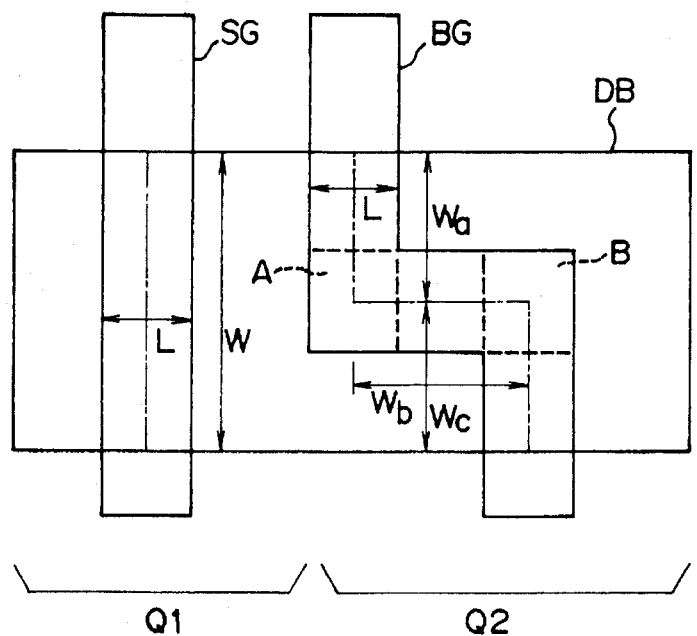
FIG. 2 is a top view showing the layout pattern of a part of a semiconductor integrated circuit device to explain a conventional parameter extraction method for circuit simulation.

In FIG. 3, the integrated circuit device includes two MOSFETs Q1 and Q2 in the same way as the device shown in FIG. 2. The MOSFET Q1 has a linear gate SG laid out rectilinearly (i.e., having a rectilinear gate pattern) on an effective area, i.e., a diffusion layer DB, whereas the MOSFET Q2 has a bent gate BG which is laid out to be bent in bends A and B (i.e., having a bent gate pattern) on a diffusion layer DB.

The diffusion layer located on the left side of the linear gate SG, for example, forms the source region of the MOSFET Q1 having the gate SG as the gate thereof. The diffusion layer located on the right side of the linear gate SG, for example forms the drain region of the MOSFET Q1.

The bent gate BG is bent to nearly make a right angle in the bends A and B. The diffusion layer located on the left side of the bent gate BG, for example, forms the source region of the MOSFET Q2 having the gate BG as the gate thereof. The diffusion layer located on the right side of the bent gate BG, for example, forms the drain region of the MOSFET Q2. Therefore, the bent gate BG is bent in the bend A to form an inner angle above the drain region and the bent gate BG is bent in the bend B to form an inner angle above the source region.

The linear gate SG has a channel length L and a channel width corresponding to the width W of the diffusion layer DB. On the other hand, the bent gate BG has a channel length L and channel widths $W_1$, $W_2$ and $W_3$ in the linear sections (exclusive of the bends A and B). Since the diffusion layer is formed typically as the linear gate SG and the bent gate BG, however, the diffusion layer gets under respective gates with a diffusion length d. Therefore, the effective channel length of each gate is reduced.

Once the layout of patterns of the diffusion layer DB, the linear gate SG, and the bent gate BG shown in FIG. 3 has been determined in pattern design of a semiconductor integrated circuit device including the MOSFETs Q1 and Q2, a virtual bend index layer BB which is an index symbol is added to the bent gate BG.

Figure 4:
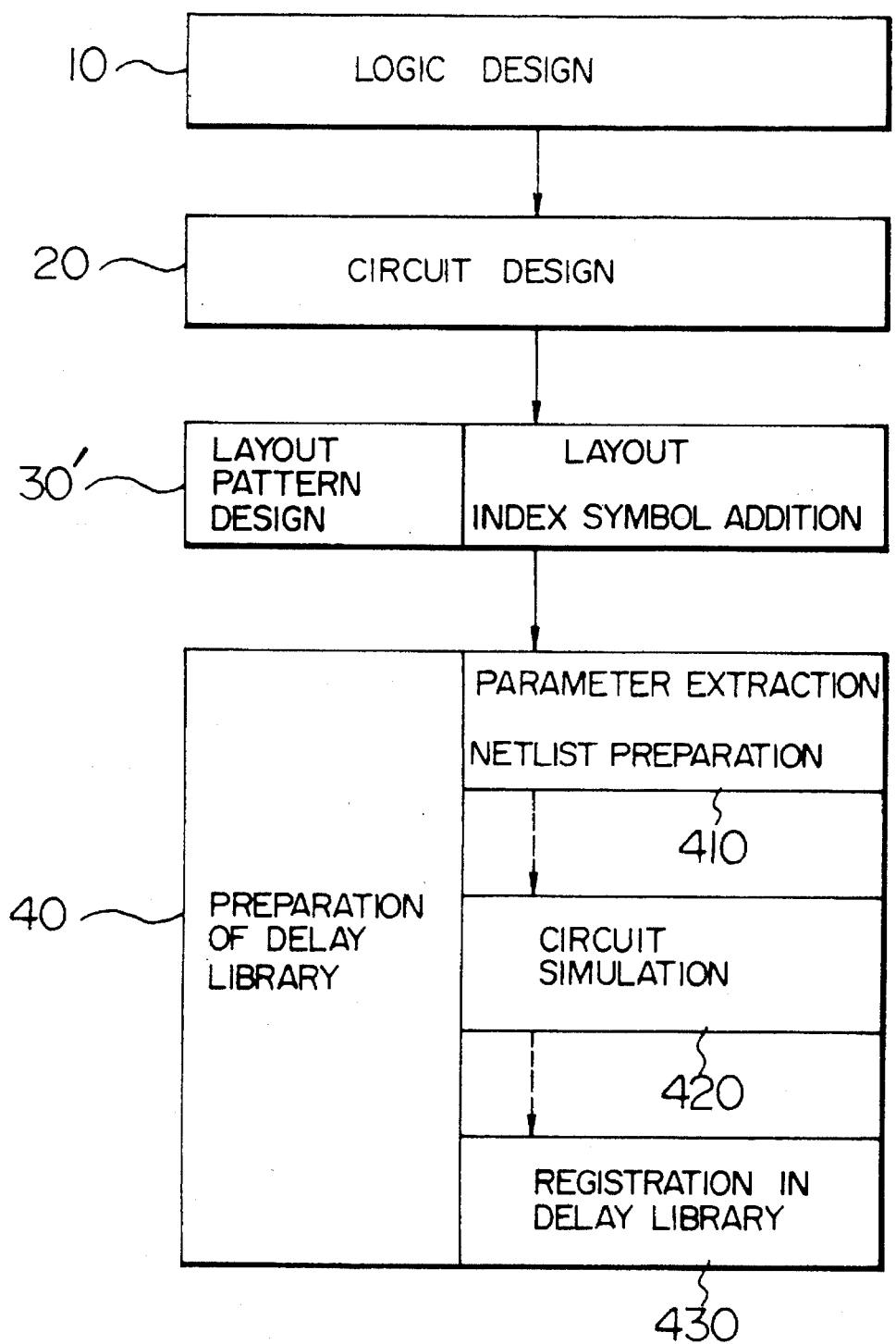
FIG. 4 is a flow diagram showing procedures for developing semiconductor integrated circuit devices according to an embodiment of the present invention.

Thus, a primary feature of the present invention is found in a layout pattern design procedure 30' of a semiconductor integrated circuit device including MOSFETs as shown in FIG. 4. In case the gate of a MOSFET has a bent gate pattern, an index symbol is added to that bent gate pattern BG in the procedure 30'. Therefore, index symbol data are included in designed pattern data of a semiconductor integrated circuit device including a MOSFET having a bent gate.

A parameter extraction procedure 410 for circuit simulation is executed by using netlist preparation based upon layout data and index symbol data (bend index layer data) which have been designed in the layout pattern design procedure 30'. In the procedure 410, therefore, an index symbol data (bend index layer data) is detected for the parameters of the bent gate. On the other hand, an index symbol data is not added to the parameters of the linear gate. Therefore, parameters of the bent gate are distinguished from parameters of the linear gate. A correction which improves circuit simulation (420) can thus be made to parameters of the bent gate.

An example of correction to parameters of the bent gate, which improves the precision of circuit simulation, will hereafter be described. This correction is effective especially for evaluation of current control capability of the MOSFETs.

The effective channel width $W_{eff1}$ of the linear gate SG is given by $$W_{eff1}=W \quad (1)$$

in a manner similar to the conventional technique. Its gate capacitance $C_{G1}$ is given by $$C_{G1}=\mu \cdot (L \cdot W) \quad (2)$$

Denoting space dielectric constant by $\epsilon_0$, dielectric constant of silicon oxide ($SiO_2$) used as the insulating film of each gate by $\epsilon_r$, and the film thickness by $T_{ox}$, $\mu$ is given by $$\mu = \epsilon_0 \cdot \epsilon_r / T_{ox}$$

Then the effective channel width $W_{eff2}$ of the bent gate BG is derived by adding the sum of the product of the effective channel width L-2d in the bend A and a current control capability coefficient $K_f$ and the product of the effective channel width L-2d in the bend B and a coefficient $K_r$ to the sum of effective channel widths $W_1+d$, $W_2+2d$, and $W_3+d$ of respective linear sections of the gate BG exclusive of the bends A and B. That is, $$\begin{aligned} W_{eff2} &= (W_1+d)+(W_2+2d)+(W_3+d)+ \\ &\quad K_f \cdot (L-2d) + K_r \cdot (L-2d) \\ &= W_1+W_2+W_3+4d+ \\ &\quad K_f \cdot (L-2d) + K_r \cdot (L-2d) \end{aligned} \quad (3)$$

In a manner similar to the conventional technique, its gate capacitance $C_{G2}$ is given by the product of the above described $\mu$ and the area of the gate. That is, $$C_{G2}=\mu \cdot [L \cdot (W_1+W_2+W_3+2L)] \quad (4)$$

The coefficient $K_f$ is given to the bend A in which the gate is bent so as to nearly make a right angle and form an inner angle above the drain region. The coefficient $K_r$ is given to the bend B in which the gate is bent so as to nearly make a right angle and form an inner angle above the source region. Specific values of these current control capability coefficients depend upon the gate voltage as well. However, deriving exemplary values in the saturation region, for example, by using a device simulator results in values of 0.45 and 0.22, respectively. Herein, the current control capability coefficient is defined as a coefficient which represents a current flowing capability of a gate. The current control capability coefficient of a linear gate is assumed to be unity (1). Those of the bends A and B shown in FIG. 3 are less than 1, because the effective channel widths of the bends are less than the effective channel width of the linear gate.

According to the parameter extraction method of this embodiment, the effective channel width $W_{eff0}$ of the bent gate having a so-called serpentine structure, in the effective area thereof, is typically given by $$W_{eff0}=\Sigma W_i-(N_f+N_r)\cdot L_{eff}+N_f K_f L_{eff}+N_r\cdot K_r \cdot L_{eff} \quad (5)$$

where $W_i$ represents the length between bends as measured along the gate central lines, $L_{eff}$ represents the effective channel length of the bent gate determined in consideration of the unintentional influence of the formation of the source/drain region on the channel length, $N_f$ represents the number of bends forming an inner right angle above the drain region, and $N_r$ represents the number of bends forming an inner right angle above the source region.

That is to say, $W_{eff0}$ is obtained by subtracting the product of the number ($N_f+N_r$) of bends and the effective channel length $L_{eff}$ from the total sum $\Sigma W_i$ of lengths $W_i$ between bends measured along the gate central lines and thereafter adding, to the result, the product of the number $N_f$ of bends each having an inner angle above the drain region, the current control capability coefficient $K_f$ thereof, and the effective channel length $L_{eff}$ and the product of the number $N_r$ of bends each having an inner angle above the source region, the current control capability coefficient $K_r$ thereof, and the effective channel length $L_{eff}$.

In the case of the bent gate BG shown in FIG. 3, the channel lengths $W_a$ to $W_c$ between bends measured along the gate central lines are given by $W_a = W_1 + L/2$ $W_b = W_2 + L$ $W_c = W_3 + L/2$ The effective channel length $L_{eff}$, the number $N_f$ of bends to the left, and the number $N_r$ of bends to the right are given by $L_{eff} = L - 2d$ $N_f = 1$ $N_r = 1$ Therefore, the equation (5) becomes $$\begin{aligned} W_{eff0} &= (W_1 + L/2) + (W_2 + L) + (W_3 + L/2) + \\ &\quad 2 \cdot (L - 2d) + \\ &\quad K_f \cdot (L - 2d) + K_r \cdot (L - 2d) \\ &= W_1 + W_2 + W_3 + 4d + \\ &\quad K_f \cdot (L - 2d) + K_r \cdot (L - 2d) \end{aligned}$$

The equation (5) thus coincides with the equation (3). Furthermore, the equation (5) can be rewritten as $$W_{eff0} = \Sigma W_i - \{N_f(1-K_f) + N_r(1-K_r)\} L_{eff} \qquad (5')$$

Figure 5A:
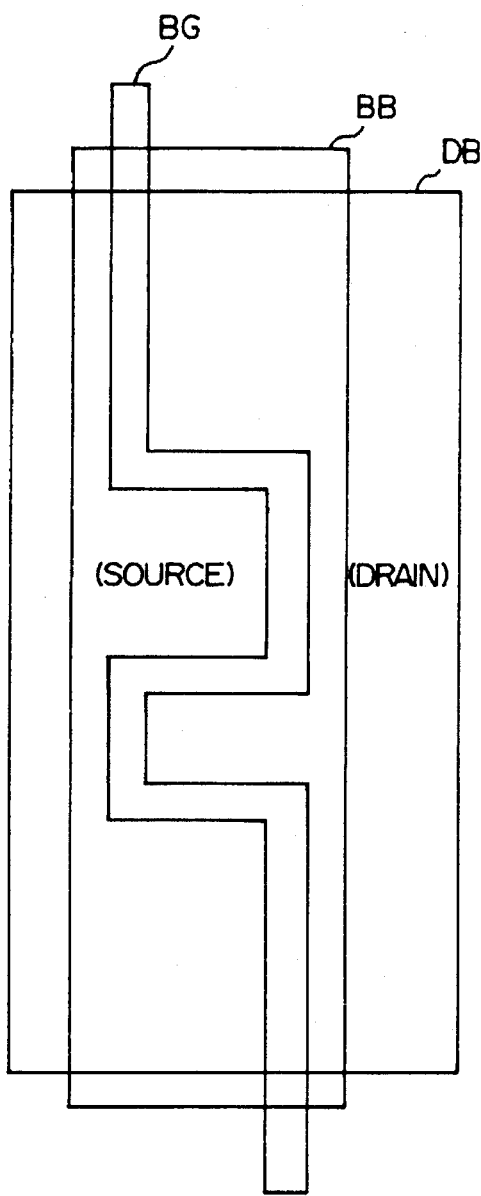
FIGS. 5A and 5B are top views showing examples of a MOSFET having a gate of serpentine structure.
Figure 5B:
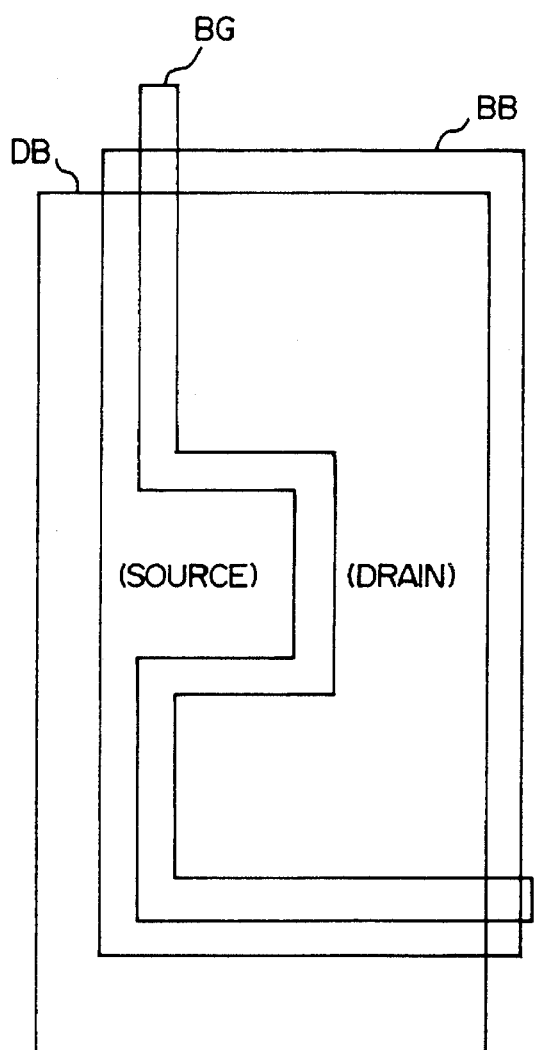

FIGS. 5A and 5B are top views of MOSFETs each having a bent gate of serpentine structure. In FIGS. 5A and 5B, elements like those of FIG. 3 are designated by identical reference numerals. In FIG. 5A, $N_f = N_r (=3)$. In FIG. 5B, $N_f (=3) \neq N_r (=2)$. As for these bent gates of serpentine structure, the effective channel width $W_{eff0}$ can be derived in the same way as the foregoing description.

As indicated by the present embodiment heretofore described, application of the present invention to the parameter extraction system for circuit simulation of an integrated circuit device or the like having MOSFETs as basic components brings about the following effects.

(1) By adding predetermined index symbol data to layout data of a linear gate or a bent gate, pattern extraction processing can be conducted while distinguishing the linear gate from the bent gate.

(2) The effective channel width of a bent gate bent in each bend so as to nearly make a right angle is derived by subtracting the product of the number of bends and the effective channel length from the total sum of lengths between bends measured along the gate central line and thereafter adding, to the result, the product of the number of bends each having an inner angle above the drain region, the current control capability coefficient thereof, and the effective channel length and the product of the number of bends each having an inner angle above the source region, the current control capability coefficient thereof, and the effective channel length. Therefore, the effective channel width of the bent gate can be derived with comparatively high accuracy.

(3) Owing to the above described (1) and (2), it is possible to improve the precision of a parameter extraction system such as a HICE system and the precision of circuit simulation of a large scale integrated circuit device or the like.

The present invention has heretofore been described concretely on the basis of the disclosed embodiments. However, it is a matter of course that the present invention is not limited to the above described embodiments, but various modifications may be made so long as they fall within the true spirit and scope of the invention. For example, in FIG. 3, the number of bends of the bent gate BG and directions thereof may be arbitrarily set. The angle of bending of the bent gate BG may be set equal to an arbitrary angle such as 30, 45 or 60 degrees. In this case, it is a matter of course that the equation for deriving the effective channel width and the values of the current control capability coefficients $K_f$ and $K_r$ vary depending upon the angle of bending. The bend index layer BB for discriminating the linear gate and bent gate may be replaced by another index symbol. Furthermore, the index layer and the index symbol may be added to the linear gate or alternatively may be added to both the linear gate and bent gate.

The foregoing has mainly been directed to the case where the invention is applied to a parameter extraction system for circuit simulation of a large scale integrated circuit device having MOSFETs as basic components, which is an application field forming the background of the invention. However, the present invention is not limited to this, but invention invention can be widely applied to parameter extraction systems of various integrated circuit devices having MOSFETs as basic components, for example.

We claim:

1. A method of extracting parameters for use in circuit simulation of an IC device having a plurality of insulated gate field-effect transistors (IGFETs), comprising the steps of:

preparing layout data for patterns for said IC device, said patterns including gate patterns for said IGFETs, at least one of said gate patterns being bent to be a bent gate pattern such that drain and source regions are defined on opposite sides of the bent gate pattern;

adding an index symbol data to a portion of the layout data which is for said bent gate pattern to thereby form designed pattern data; and detecting said index symbol data in said designed pattern data and producing, by use of the detected index symbol data, parameters concerning said gate patterns for said IGFETs, thereby contributing to determination of a capability of controlling electric current in said IGFETs.

2. A method according to claim 1, wherein said index symbol data is a data for an index layer having a substantially rectangular area encompassing said bent gate pattern.

3. A method according to claim 1, wherein said parameters are effective channel widths of said IGFETs.

4. A method according to claim 3, wherein said bent gate pattern has a serpentine structure having $(N_f + N_r \geq 1)$ bends where $N_f$ assumes zero or a positive integer and represents a number of times of bending to form an inner angle above said drain region and $N_r$ assumes zero or a positive integer and represents a number of times of bending to form an inner angle above said source region, and said effective channel width $W_{eff}$ is determined as $$W_{eff} = \Sigma W_1 - \{N_f(1-K_f) + N_r(1-K_r)\} L_{eff}$$

Where, $\Sigma W_i$, $K_f$, $K_r$ and $L_{eff}$ represent the following:

$\Sigma W_i$: a total length of the bent gate pattern as measured along its central lines, $K_f$, $K_r$: current control capability coefficients of the bends for $N_f$ and $N_r$, respectively, and $L_{eff}$: an effective channel length of the bent gate pattern determined in consideration of unintentional influence of formation of source/drain regions on a channel length.

5. In a method of circuit simulation for an integrated circuit device having a plurality of field-effect transistors, a parameter extraction method comprising the steps of:

(a) preparing layout data representing a layout pattern of one of said plurality of field effect transistors;

(b) adding an index symbol data to said layout data when said layout pattern is a non-linear pattern, thereby forming designed pattern data;

(c) extracting a circuit parameter of said one of said plurality of field effect transistors based upon the layout data and the designed pattern data;

(d) repeating steps (a)–(c) for each of said plurality of field effect transistors;

wherein said non-linear pattern is a bent gate pattern having source and drain regions defined on opposite sides thereof;

wherein said circuit parameter is an effective channel width of said field effect transistor; and wherein said bent gate pattern has a serpentine structure having $(N_f+N_r \geq 1)$ bends where $N_f$ assumes zero or a positive integer and represents a number of times of bending to form an inner angle above said drain region and $N_r$ assumes zero or a positive integer and represents a number of times of bending to form an inner angle above said source region, and said effective channel width $W_{\mathit{eff}}$ is determined as $$W_{\mathit{eff}} = \Sigma W_1 - \{N_f(1-K_f) + N_r(1-K_r)\} L_{\mathit{eff}}$$

Where, $\Sigma W_1$, $K_f$, $K_r$ and $L_{\mathit{eff}}$ represent the following:

$\Sigma W_1$: a total length of the bent gate pattern as measured along its central lines, $K_f$, $K_r$: current control capability coefficients of the bends for $N_f$ and $N_r$, respectively, and $L_{\mathit{eff}}$: an effective channel length of the bent gate pattern determined in consideration of unintentional influence of formation of source/drain regions on a channel length.

6. A method according to claim 5, wherein said index symbol data is data for an index layer having a substantially rectangular area encompassing said bent gate pattern.

* * * * *